(12) United States Patent
Gilley et al.

(10) Patent No.: US 9,589,598 B1
(45) Date of Patent: Mar. 7, 2017

(54) CONFIGURABLE SPACECRAFT PROCESSOR SYSTEM

(75) Inventors: Daniel J. Gilley, Morgan Hill, CA (US); Edwin Y. Wong, Cupertino, CA (US); Gary L. Heinz, San Carlos, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 758 days.

(21) Appl. No.: 13/571,240

(22) Filed: Aug. 9, 2012

Related U.S. Application Data

(60) Provisional application No. 61/522,206, filed on Aug. 10, 2011.

(51) Int. Cl.
    *G11C 5/00* (2006.01)
    *H03K 19/173* (2006.01)
    *G06F 13/40* (2006.01)

(52) U.S. Cl.
    CPC .......... *G11C 5/005* (2013.01); *G06F 13/4081* (2013.01); *H03K 19/173* (2013.01)

(58) Field of Classification Search
    CPC .... G11C 5/0005; G11C 5/005; H03K 19/173; G06F 13/4081
    USPC .......................................... 713/100; 361/752
    See application file for complete search history.

(56) References Cited

U.S. PATENT DOCUMENTS

| | | | |
|---|---|---|---|
| 6,105,088 A * | 8/2000 | Pascale et al. ................ | 710/100 |
| 6,822,874 B1 * | 11/2004 | Marler ........................... | 361/752 |
| 6,850,415 B2 * | 2/2005 | Dimarco ........................ | 361/752 |
| 7,809,936 B2 * | 10/2010 | Einloth et al. ................. | 713/100 |
| 8,184,555 B1 * | 5/2012 | Mouton .............. | H04L 43/0811 370/254 |
| 2002/0010902 A1 * | 1/2002 | Chen .......................... | G06F 1/10 716/117 |
| 2005/0027409 A1 * | 2/2005 | Marshall ................. | H01L 27/24 701/13 |
| 2009/0261857 A1 * | 10/2009 | Marshall, Jr. .......... | G11C 5/005 326/38 |

(Continued)

OTHER PUBLICATIONS

"VMEbus Extensions for Instrumentation System Specification VXI-1." VXI Bus Consortium, Rev. 4.0 May 27, 2010.

(Continued)

*Primary Examiner* — Jaweed A Abbaszadeh
*Assistant Examiner* — Terrell Johnson
(74) *Attorney, Agent, or Firm* — McDermott Will & Emery LLP

(57) ABSTRACT

A configurable mission processor (CMP) is disclosed that includes a chassis with a plurality of reprogrammable processor modules (RPMs) disposed within the chassis. Each RPM has a baseboard with at least one field programmable gate array (FPGA) and a configuration manager configured to accept a configuration file through an externally accessible signal connector, store the configuration file, and selectably program the at least one FPGA using the configuration file. The RPM includes a power submodule that accepts unregulated power through an externally accessible power connector, generates regulated power at a plurality of voltages, and provide the regulated power to the RPM. The RPM may also include an input/output submodule configured to provide a communication channel between the at least one FPGA and external devices through its own externally accessible signal connector. The CMP also includes a backplane that provides only signal and ground interconnections between the baseboards.

21 Claims, 13 Drawing Sheets

(56) References Cited

U.S. PATENT DOCUMENTS

2009/0322440 A1* 12/2009 Inglis ..................... H01P 1/387
333/1.1
2010/0110645 A1* 5/2010 Campini ............. G06F 13/4081
361/752
2012/0065813 A1* 3/2012 Nguyen ................ H04L 67/125
701/2

* cited by examiner

CONFIGURABLE SPACECRAFT PROCESSOR SYSTEM

CROSS-REFERENCE TO RELATED APPLICATIONS

This application claims priority to U.S. Provisional Application No. 61/522,206, filed Aug. 10, 2011, which is incorporated herein by reference.

STATEMENT REGARDING FEDERALLY SPONSORED RESEARCH OR DEVELOPMENT

Not applicable.

BACKGROUND

Field

The present disclosure generally relates to configurable electronics and, in particular, electronics adapted for use in spacecraft.

Description of the Related Art

Mission control processors for satellites and other spacecraft are often customized for each mission to fit the unique requirements of the payload. Given the cost per pound of launching a spacecraft into orbit or beyond, it is vital that each pound of equipment operate at the highest possible efficiency. It is typically justifiable to spend the time and effort to produce one or more Application-Specific Integrated Circuits (ASICs) customized to the particular requirements of each mission. A typical ASIC may cost $3-10 M dollars and take 2-3 years to develop. Additionally, the printed circuit board assemblies (PCBAs) must be custom-designed to each set of ASICs.

SUMMARY

There is a need to provide space-capable configurable mission processor (CMP) that can be easily configured to handle a variety of tasks that are required on spacecraft. The CMP would be based on a modular architecture that allows the re-use of previously validated modules to provide specific capabilities, thus shortening the design time and reducing costs. The CMP disclosed herein provides these capabilities and more.

In certain embodiments, a configurable mission processor (CMP) is disclosed that includes a chassis and a plurality of reprogrammable processor modules (RPMs) disposed within the chassis. Each RPM includes at least one externally accessible signal connector, a baseboard comprising at least one field programmable gate array (FPGA) having a configuration and a configuration manager (CM) coupled to the at least one FPGA and the at least one externally accessible signal connector. The CM is configured to accept through the at least one externally accessible signal connector and store a configuration file. The CM is further configured to selectably program the at least one FPGA using the configuration file. The RPM also includes a power submodule coupled to the baseboard. The power submodule comprises at least one externally accessible power connector. The power submodule is configured to accept unregulated power through the at least one externally accessible power connector, generate regulated power at a plurality of voltages, and provide the regulated power to the RPM. The CMP also includes a backplane disposed within the chassis and coupled to the baseboard of each of the plurality of RPMs. The backplane is configured to provide only signal and ground interconnections between the baseboards.

In certain embodiments, a reprogrammable processor module (RPM) is disclosed that includes a baseboard comprising a first connector element of a low-impedance connector and a power submodule coupled to the baseboard. The power submodule comprises a second connector element of the low-impedance connector and a power connector. The power submodule is configured to accept unregulated power through the at least one externally accessible power connector and provide regulated power to the baseboard through the low-impedance connector. The second connector element is mated with the first connector element of the baseboard to provide a low-impedance connection between the power submodule and the base board. The mated first and second connector elements comprise a low-impedance contact area between the first and second connector elements.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The method and system disclosed herein are presented in terms of a spacecraft processor system configured to interact with a variety of spacecraft systems such as guidance and control, power, communication, and other typical elements of a spacecraft. The concepts disclosed herein provide a system of modular, configurable hardware that allows mission processors to be developed faster and with less risk than systems using custom-designed hardware such as application-specific integrated circuits (ASICs). The use of FPGAs on the baseboard allows a tested, verified hardware platform to be configured to provide a variety of functions such as channelization, beamforming, signal detection, focal plane processing, data compression, and data framing/switching. The use of RPMs that can be plugged into a backplane that provides configurable interconnection between RPMs provides a scalable architecture such that the number of RPMs in a particular CMP is tailored to the mission requirements. The use of separate submodules for power conversion and input/output connections allows these portions of the CMP, which tend to be the most mission-specific aspects of the CMP design, to be modified without impact to the basic processing capability of each RPM.

It will be apparent to those of skill in the art that this type of processor system may be applied to a variety of other applications, including manned and unmanned aircraft, industrial processes, and other applications where ease of development and modular systems provide benefits. Nothing in this disclosure should be interpreted, unless specifically stated as such, to limit the application of any method or system disclosed herein to a spacecraft application.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

Figure 1:
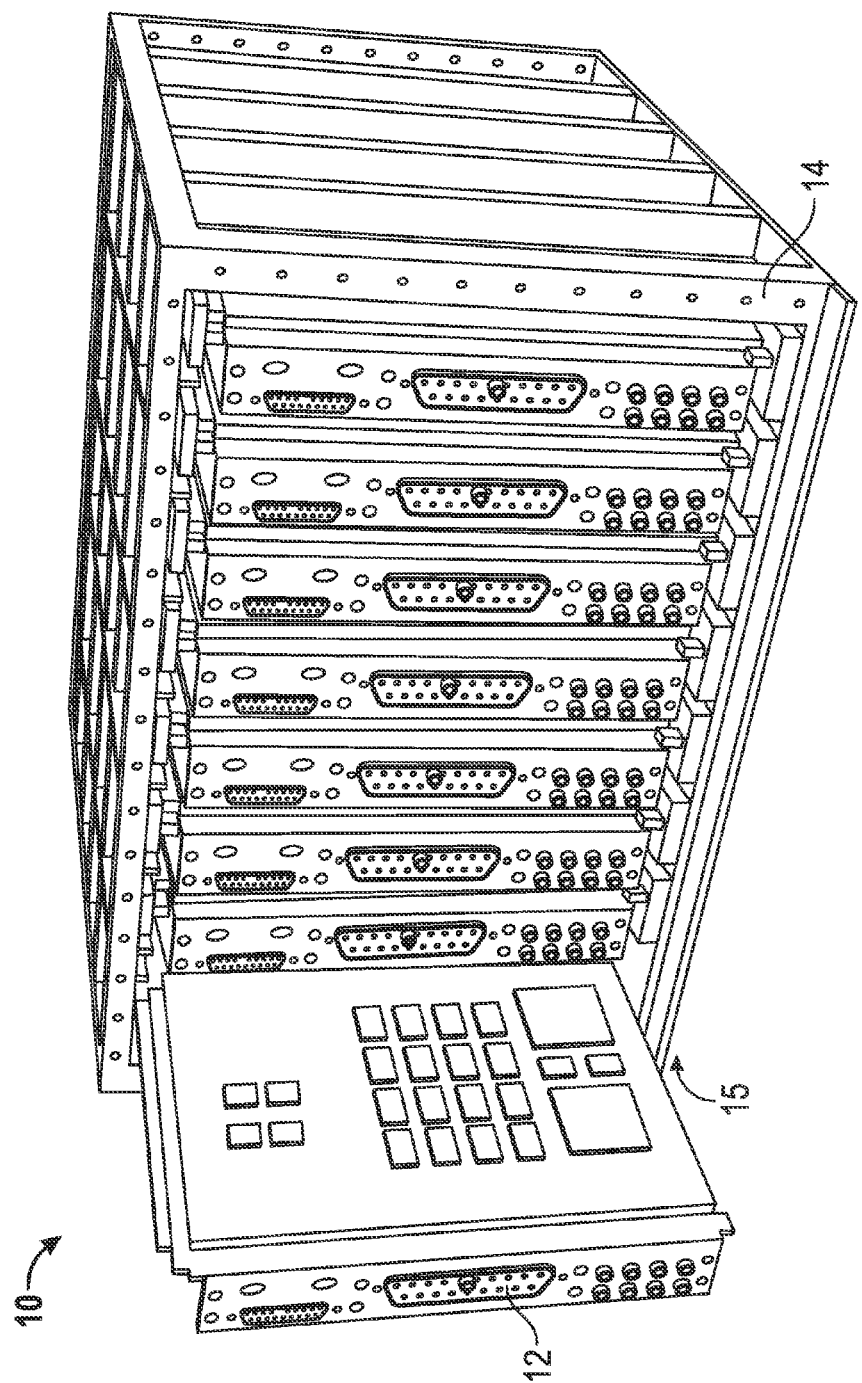
FIG. 1 is a perspective view of an exemplary CMP according to certain aspects of this disclosure.

The following acronyms are used herein:
ASIC Application Specific Integrated Circuit
CM Configuration Manager
CMP Configurable Mission Processor
C&DH Command and Data Handling
DRAM Dynamic Random-Access Memory
EMI ElectroMagnetic Interference
FPGA Field Programmable Gate Array
I/O Input/Output
IOD Input/Output Daughterboard
LVDS Low Voltage Differential Signal
MGT Multi-Gigabyte Transceiver
PIO Programmable Input/Output
POLD Point-of-Load Daughterboard
PROM Programmable Read-Only Memory
QDR RAM Quadruple-Data-Rate Random-Access Memory
RPM Reconfigurable Processor Module
SerDes Serializer/Deserializer
SEU Single Event Upset
VDC Volts, Direct Current FIG. 1 is a perspective view of an exemplary CMP 10 according to certain aspects of this disclosure. The CMP 10 comprises a chassis 14 configured, in this example, as a rectangular box having eight slots 15 into which can be inserted RPMs 12. The RPMs 12 are described in greater detail with respect to at least FIGS. 4A-5. In certain embodiments, some of the slots 15 are left empty. In certain embodiments, the chassis 14 is configured to provide thermal management. In certain embodiments, the chassis 14 is configured to provide electromagnetic interference (EMI) management. In certain embodiments, a cover plate (not shown in FIG. 1) is added over the side of enclosure 14 to provide additional mechanical stiffness and additional EMI shielding.

Figure 2:
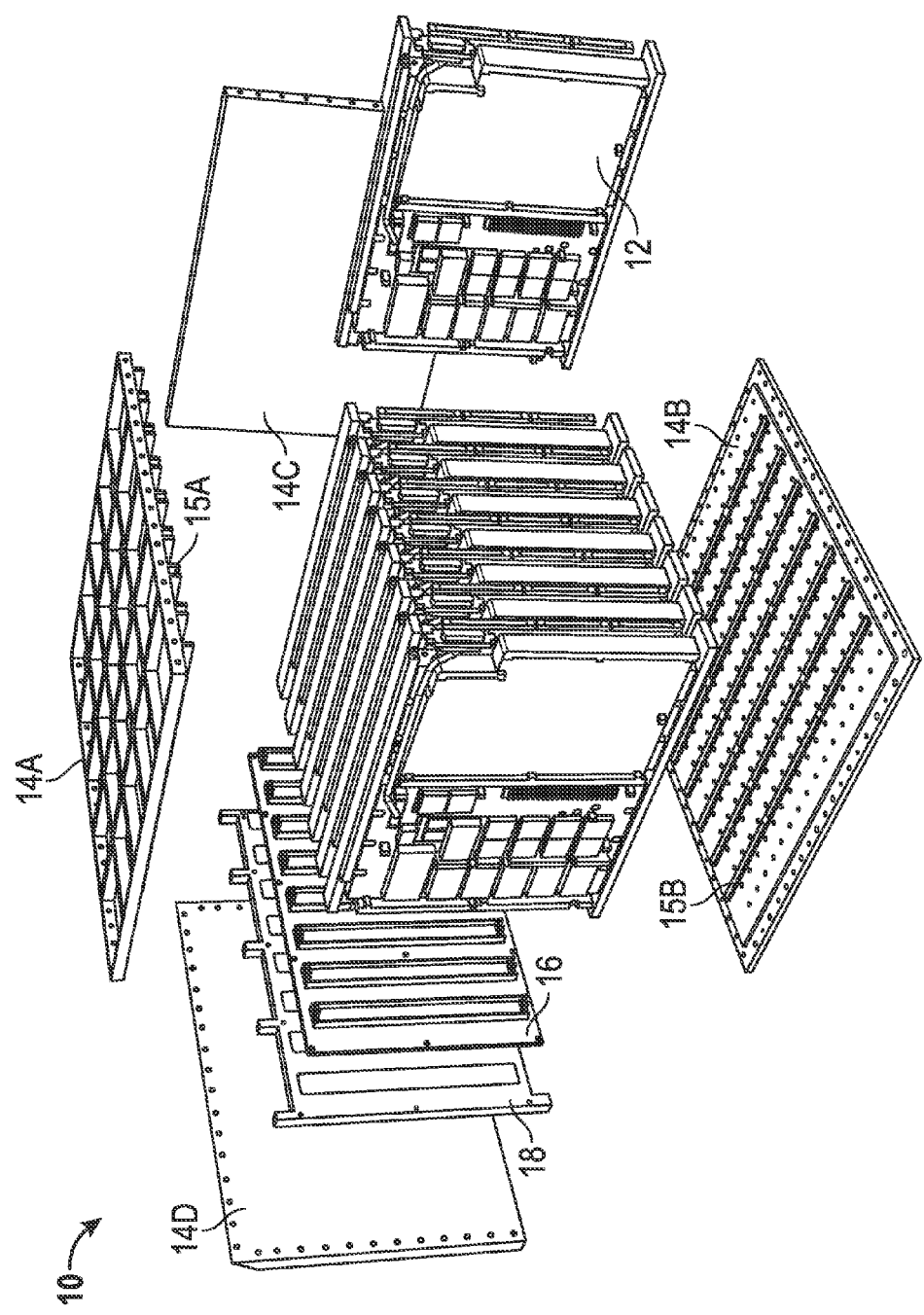
FIG. 2 is an exploded view of an example CMP according to certain aspects of this disclosure.

FIG. 2 is an exploded view of an example CMP 10 according to certain aspects of this disclosure. The chassis 14 is built from a top panel 14A, a bottom panel 14B, two side panels 14C (one panel 14C is not shown so as to make internal components visible), and a back panel 14D. The top panel 14A and bottom panel 14B, in this example, comprise tabs 15A and 15B that form slots 15. In certain embodiments, the panels 14A-14D comprise an aluminum alloy. In certain embodiments, the panels 14A-14D comprise an aluminum beryllium alloy.

A backplane 16 is located near the back panel 14D and configured to interconnect the RPMs 12. The configuration of the backplane 16 is discussed in greater detail with respect to FIGS. 12-15. A backplane support 18 is located adjacent to the backplane 16 to provide structural support to the backplane 16.

The architecture of the CMP 10 provides the ability to scale the capabilities of a particular CMP 10 to the needs of the mission of the spacecraft on which the CMP 10 will be used. The cost per pound of a satellite is so high that it is impractical to use an over-sized computer having excess processing capability beyond the needs of a spacecraft. A CMP 10 can be designed using one, two, or ten of the RPMs 12 such that just enough processing power is provided.

Figure 3:
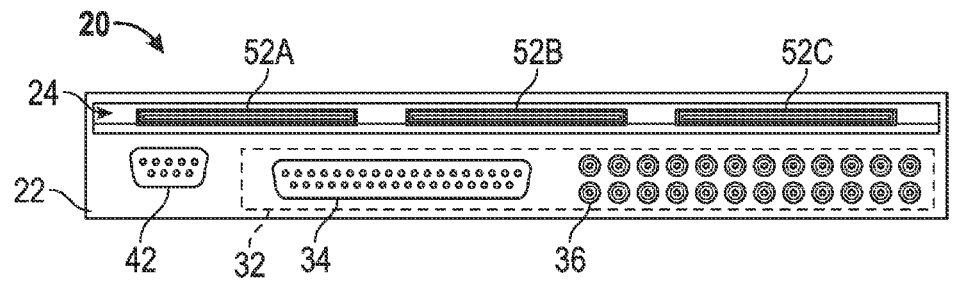
FIG. 3 is a side view of an example external interface of a Reconfigurable Processor Module (RPM) according to certain aspects of this disclosure.

FIG. 3 is a side view of an example external interface 20 of a RPM 12 according to certain aspects of this disclosure. The external interface 20 is configured to provide power to the RPM 12 and connector signal cables from external systems to this particular RPM 12. With regard to the RPM 12 disclosed herein, the concept of "externally accessible" is intended to indicate that the connectors, or other item being described, are accessible while the CMP 10 is completely assembled. In this regard, the external interface 20 of FIG. 3 is exposed and cable harnesses may be connected to the connectors 42, 34, 36, 52A, 52B, and 52C when the CMP 10 is assembled. In certain embodiments, all power required by the RPM 12 is provided through the external interface 20. The interface 20 comprises an interface panel 22 having a slot 24 that exposes, in this example, three connectors 52A, 52B, and 52C mounted on the baseboard 50. The panel 22 also has a cutout and attachment provisions, i.e. threaded holes (not visible in FIG. 3), for a power connector 42, shown in this example as a 9-pin sub-D style connector. The interface panel 22 also has an area 32 defined to connectors mounted on an Input/Output (I/O) submodule 30. In this example, the interface panel 22 includes cutouts and attachment provisions for a 37-pin sub-D style connector 34 and 24 coaxial connectors 36 that are mounted on the I/O submodule 30. In certain embodiments, there are no connectors in area 32. In certain embodiments, there is no slot 24. In certain embodiments, there is no external direct access, i.e. no externally accessible connector, to the backplane 16 when the CMP 10 is assembled.

Figure 4A:
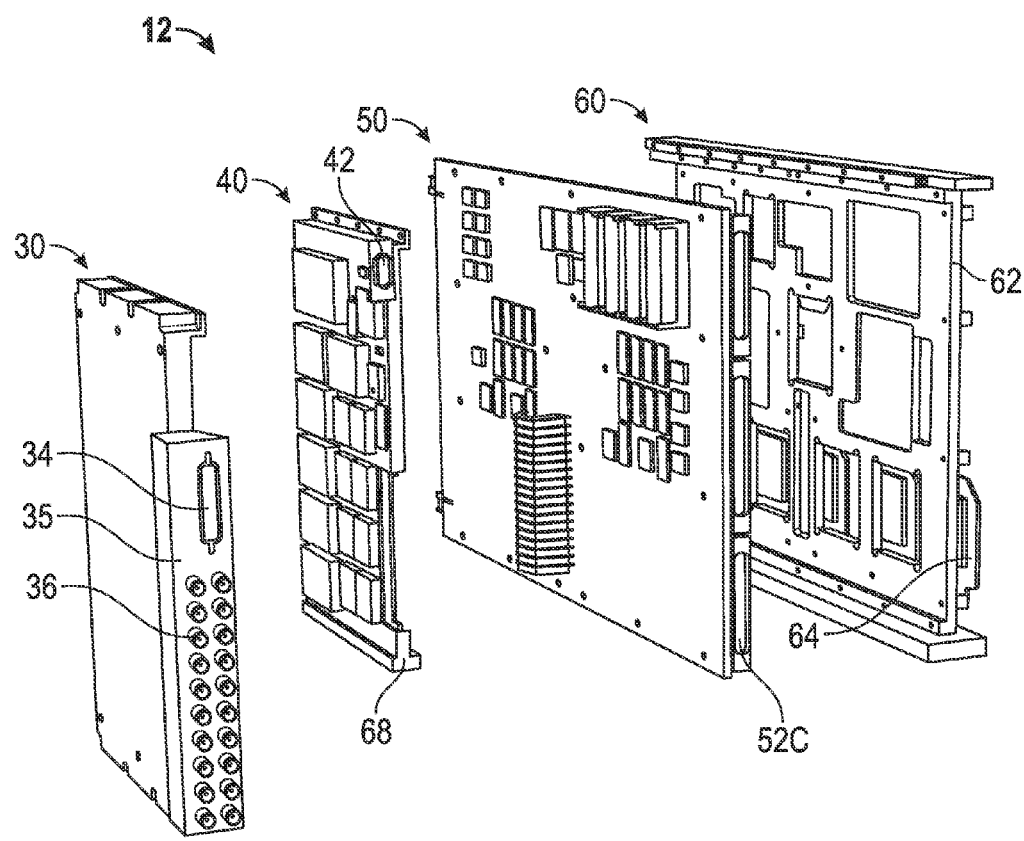
FIG. 4A is an exploded view of an example RPM according to certain aspects of this disclosure.

FIG. 4A is an exploded view of an example RPM 12 according to certain aspects of this disclosure. The RPM 12 comprises a baseboard 50 to which are coupled a power submodule 40 and an I/O submodule 30. The connectors 52A, 52B, 52C are visible at the edge of the baseboard 50. In this example, the I/O submodule 30 includes a faceplate 35 to which are mounted the connectors 34 and 36. The power submodule 40 is sometimes referred to as a "point-of-load daughterboard" or "POLD" and the I/O submodule 30 is sometimes referred to as an "input/output daughterboard" or "IOD" with respect to the baseboard 50, which is sometimes referred to as the main board.

The modular design of the RPM 12 separates certain functional areas, such as power conversion, into a separate power submodule 40 while certain core functions, such as signal processing, are located on a baseboard 50 that can be reused for many different missions. The voltage and quality of the power available from the spacecraft power system may vary between spacecraft and the same baseboard 50 may be used on different spacecraft by using different power submodules 40 that are designed to use the particular power from each spacecraft. In certain embodiments of the CMP 10, the power submodule 40 is configured to accept the power according to the particular spacecraft and the same power submodule 40 is used in all RPMs 12 in that CMP 10. In certain embodiments, different power submodules may be used for one of more of the RPMs 12 so as to provide different amounts of power. The function and design of the power submodule 40 are described in greater detail with respect to FIG. 6.

Similarly, the different mission requirements and payloads of different spacecraft may require very different types of signals be accepted or provided by the CMP 10. Separation of the input and output drivers and connectors into a separate I/O submodule 30 allows customization of the connection of each of the RPMs 12 to the rest of the spacecraft without modification of the baseboard 50.

Figure 5:
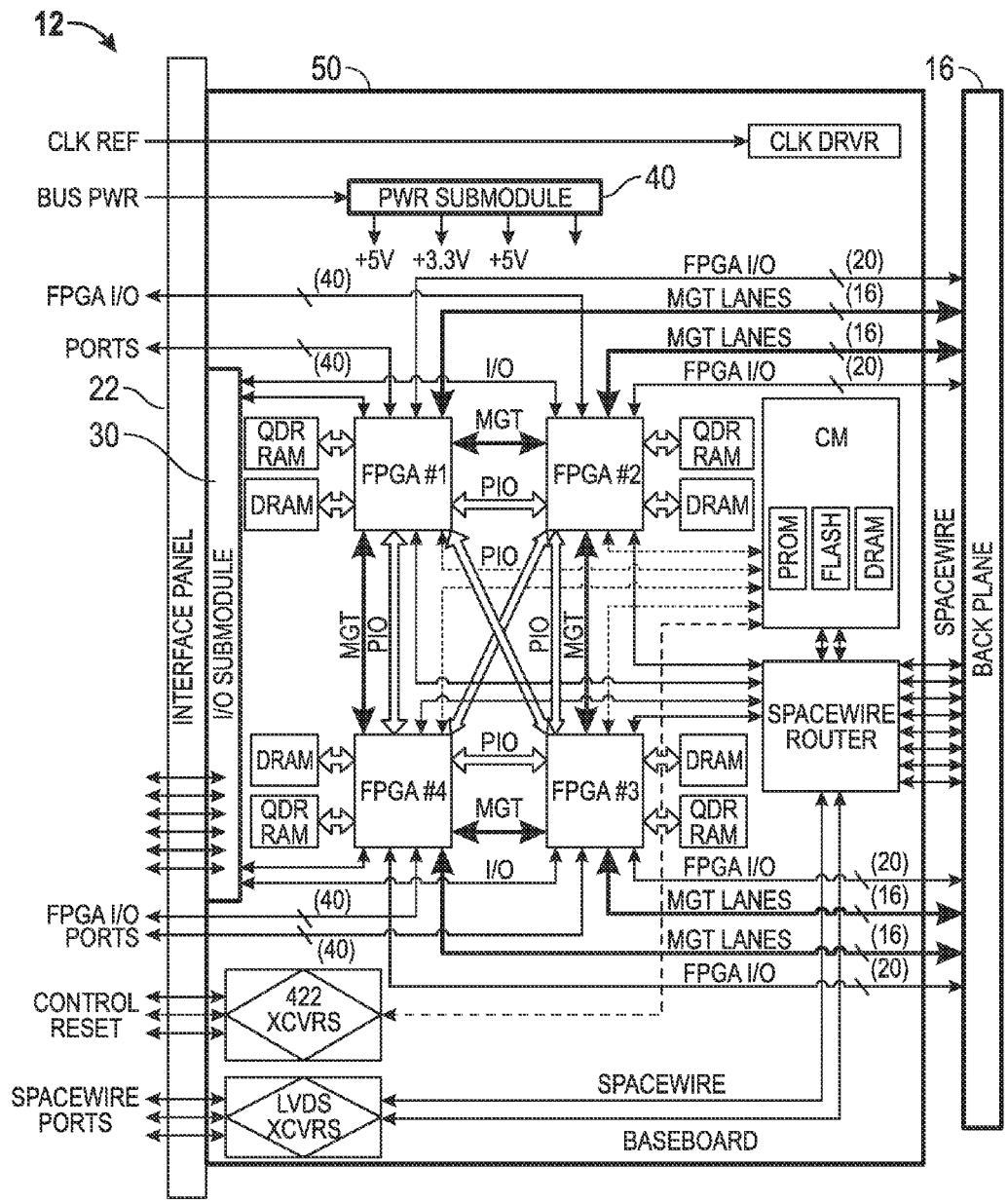
FIG. 5 is a block diagram that schematically illustrates some of the interconnection of various components of a RPM according to certain aspects of this disclosure.

In certain embodiments, the baseboard 50 of all of the RPMs 12 of the CMP 10 are identical in hardware and are programmed to perform different functions as described in greater detail with respect to FIG. 5. In certain embodiments, two or more configurations of RPMs 12 are used in a single CMP 10 so as to further tailor the computational capabilities of each RPM 12 to its function for the particular mission.

The RPM 12 also includes a heat sink 60 comprising a heat sink plate 62 and, in this example, a plurality of thermal transfer covers 64. The design and function of heat sink 60 are discussed in greater detail with respect to FIGS. 10 and 11. In certain embodiments, a secondary heat sink 68 is mounted to the PCBA 44 of the power submodule 40. The secondary heat sink 68 is thermally coupled to the heat-generating components, for example the power converters of FIG. 6, and also thermally coupled to the heat sink 62. This allows heat from the power submodule 40 to be transferred to the chassis 14, as is discussed in greater detail with respect to FIG. 10, without passing through the baseboard 50.

Figure 4B:
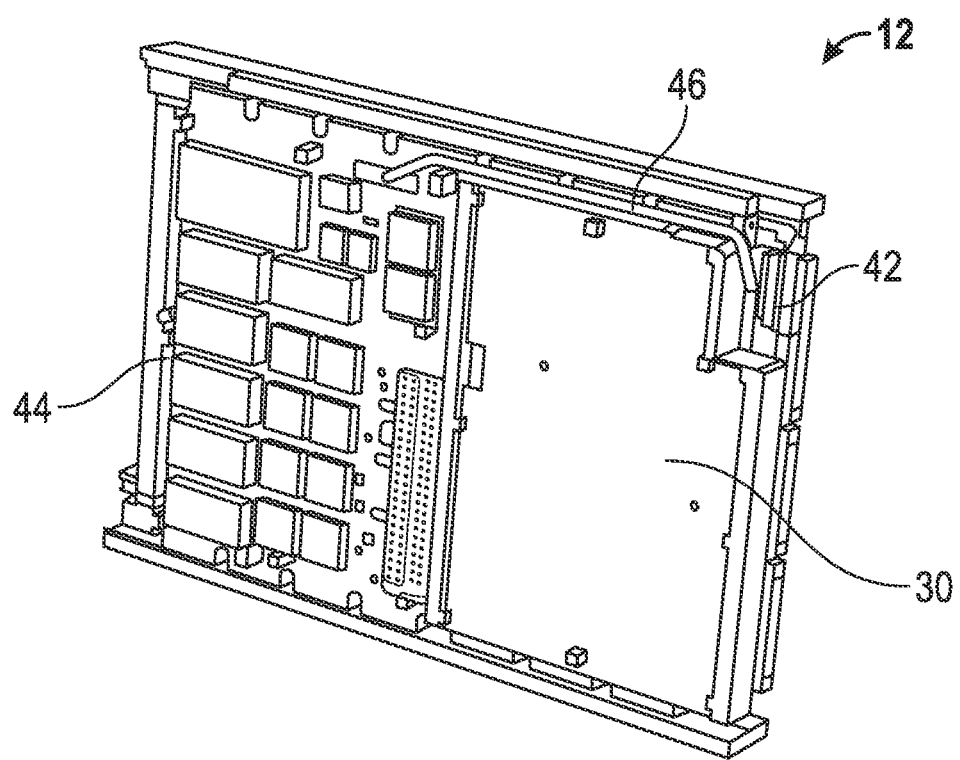
FIG. 4B is a side view of the assembled RPM of FIG. 4A according to certain aspects of this disclosure.

FIG. 4B is a side view of the assembled RPM 12 of FIG. 4A according to certain aspects of this disclosure. In this view, it can be seen that the connector 42 is located at the front edge of the RPM 12 such that the connector 42 is accessible when the RPM 12 is installed in the chassis 14. The PCBA 44 of the power submodule 40, in this embodiment, is located behind the I/O submodule 30 and connected to the connector 42 through a cable 46. In this configuration, the power submodule 40 and the I/O submodule 30 are positioned in a common plane adjacent to the baseboard 50. In certain embodiments, the RPM 12 has a defined volume (not shown) into which all of the attached submodules 30, 40 must fit and the chassis 14 is configured to accept RPMs 12 that conform to this defined volume.

FIG. 5 is a block diagram that schematically illustrates some of the interconnection of various components of a RPM 12 according to certain aspects of this disclosure. The baseboard 50 is shown as connected to a front panel 22 and a backplane 16. In this embodiment, the baseboard 50 includes four FPGAs, numbered #1-#4, that are interconnected with programmable input/output (PIO) lines and multi-gigabyte transceiver (MGT) lines. Each FPGA #1-#4 has a dedicated amount of memory that, in this example, includes dynamic random-access memory (DRAM) and quadruple-data-rate random-access memory (QDR RAM). In certain embodiments, the baseboard comprises a single FPGA.

Each of the FPGAs #1-#4 are also connected to the backplane 16 through individual I/O and MGT lines and to I/O connectors, such as connectors 52A, 52B, and 52C of FIG. 3, on the interface panel 22. In this embodiment, there are 40 lines from each FPGA #1-#4 to front panel I/O connectors.

The baseboard 50 also includes a SpaceWire Router. SpaceWire is a communication standard defined in the European Cooperation for Space Standardization ECSS-E50-12A standard. SpaceWire links are serial, high-speed (2 Mbits/sec to 200 Mbits/sec), bi-directional, and full-duplex. In this embodiment, the SpaceWire router is connected to the FPGAs #1-#4, a low voltage differential signal (LVDS) driver connected to ports on the interface panel 22, and the backplane 16.

The baseboard 50 also includes a configuration manager (CM) that is coupled to the SpaceWire router and the FPGAs #1-#4 as well as a dedicated RS-422 transceiver coupled to a connector on the interface panel 22. The CM includes programmable read-only memory (PROM), flash memory, and DRAM memory. In certain embodiments, the PROM stores a configuration file containing instructions related to programming the FPGAs #1-#4 and the CM is configured to selectably program one or more of the FPGAs #1-#4 from the stored instructions. In certain embodiments, the CM performs continuous autonomous monitoring of the configuration of one or more of the FPGAs #1-#4, detects any Single Event Upsets (SEUs) affecting that configuration, records information related to a detected SEU in telemetry, and optionally autonomously restores the affected one or more of the FPGAs #1-#4 to the correct state. In certain embodiments, the CM is further configured to accept a reload command through SpaceWire router from an external system, such as a Command and Data Handling (C&DH) processor, and upon receipt of the reload command, program one or more of the FPGAs #1-#4 using the stored configuration file. In certain embodiments, this allows the FPGAs #1-#4 to be returned to their original configuration after an event such as a gamma ray strike that alters the configuration while in orbit. In certain embodiments, new configurations can be uploaded to the CM through either the backplane 16 or I/O submodule 30 connectors. In certain embodiments, alternate sets of configuration instructions are stored in the PROM such that one or more of the FPGAs #1-#4 can be configured in different configurations at various times during operation, for example to reconfigure the entire CMP 10 after failure of an external device or spacecraft system.

In certain embodiments, the RPM 12 also includes a power submodule 40 coupled to the baseboard 50 and configured to receive bus power through the interface panel 22 and provide a variety of voltages to the baseboard 50. The function of the power submodule 40 is described in greater detail with respect to FIG. 6. The RPM 12 also includes a I/O submodule 30 connected to each of the FPGAs #1-#4 through I/O lines and to external connectors, such as connectors 34 and 36 of FIG. 3, on the interface panel 22.

In certain embodiments, synchronization of the operation of the RPM 12 with other RPMs 12 and external systems is maintained through input of a clock reference signal through a connector, such as connector 52A, 52B, and 52C, on the interface panel 22.

Figure 6:
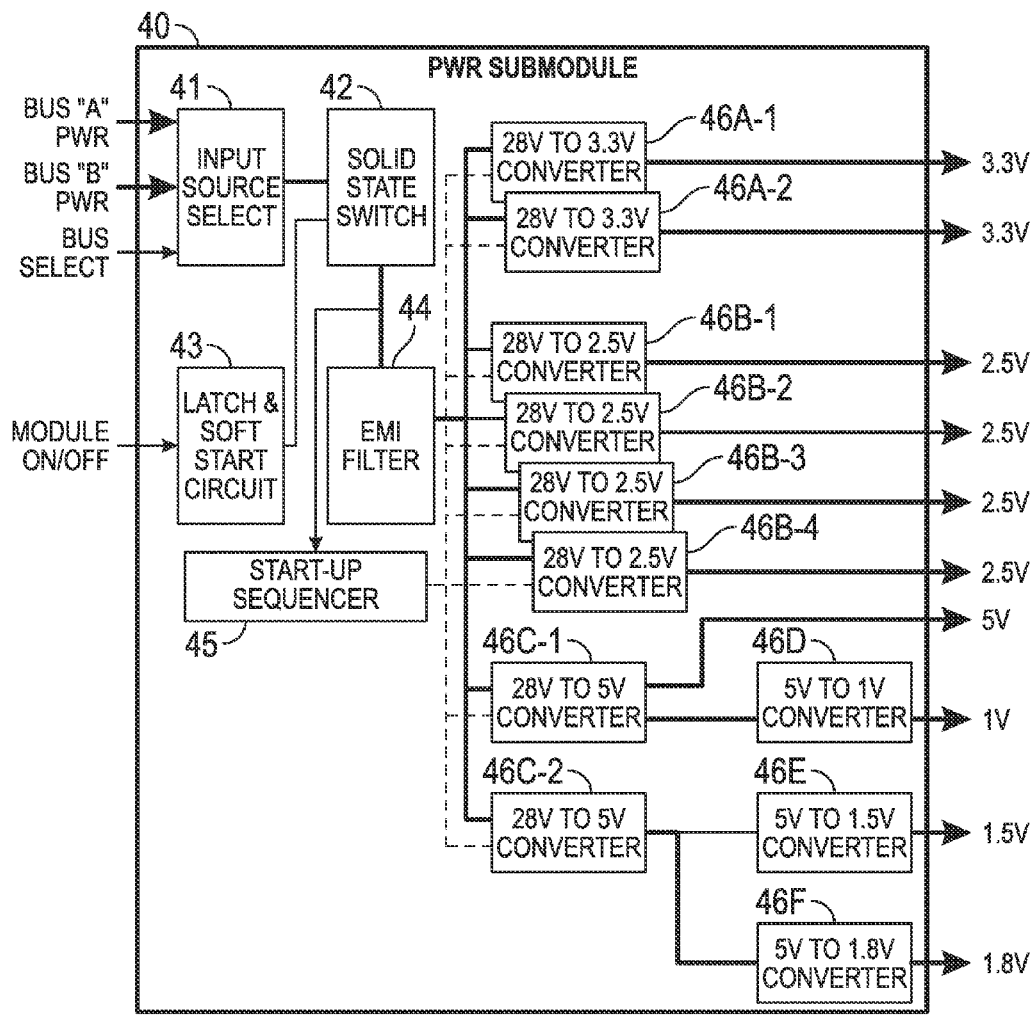
FIG. 6 is a block diagram of an exemplary power submodule according to certain aspects of this disclosure.

FIG. 6 is a block diagram of an exemplary power submodule 40 according to certain aspects of this disclosure. In this example, power is supplied on two busses A and B. In certain embodiments, the power on busses A and B is considered "unregulated" in that the voltage may vary over a wide range, such as 20-38 VDC, for a particular spacecraft and may have undesirable characteristics such as voltage spikes, voltage dropouts, and electronic "noise" over a wide range of frequencies. Having the power conversion functionality on a submodule, rather than on the baseboard 50, allows a common baseboard 50 to be used on different spacecraft that provide the unregulated power at different voltages. For example, a first spacecraft may provide unregulated power at a nominal 70 VDC, whereas a second spacecraft may provide power at a nominal 28 VDC. Efficient power conversion from sources at these two different voltages may require the use of different electrical components. By placing all of the power conversion components on the power submodule 40, a common baseboard 50 can be mated with two different power submodules 40 to be used on the two spacecraft.

The power submodule 40 includes a input source select module 41 that is selectively coupled to both busses A and B and to a "bus select" input signal that provides a command that configures the input source select module 41 to connect to one of power busses A and B. Power received from one of the busses A or B is then, in this example, routed through a solid-state switch 42 to which is also connected a latch and soft-start circuit 43. The latch and soft-start circuit 43 accepts a on/off signal from an external source and, in certain embodiments, is configured to operate the solid-state switch 42, for example using pulse-width or pulse-frequency modulation, to bring up the voltage on the line to the EMI filter module 44 slowly thereby avoiding inrush current and voltage spikes. The EMI filter module 44 is configured to filter the voltage, for example with capacitors and inductors, so as to remove at least a portion of the undesirable characteristics of the power received from busses A or B.

The power submodule 40, in this example, also includes a plurality of power converter modules 46A-46F. Certain modules, such as power converter modules 46A, 46B, and 46C, convert the filtered, unregulated voltage from the EMI filter 44 to a specific voltage, such as 3.3 VDC, 2.5 VDC, or 5.0 VDC. If the amperage required of a specific voltage exceeds the capability of an individual power converter module, multiple identical power converter modules, such as modules 46B-1, 46B-2, 46B-3, and 46B-4, are provided in parallel so as to provide a total current capacity adequate to the system. In certain embodiments, a secondary power converter module, such as module 46D, is configured to convert a voltage from another power converter module, such as module 46C-1. This type of two-step power conversion may offer improved efficiency compared to a single conversion from 28 VDC to 1 VDC or may provide a more tightly controlled voltage. The power converter modules 46A-46F are controlled by a start-up sequencer that is configured to bring up the power converters 46A-46F in sequential groups such that the inrush power draw is reduced and the stability of the system is improved.

Figure 7:
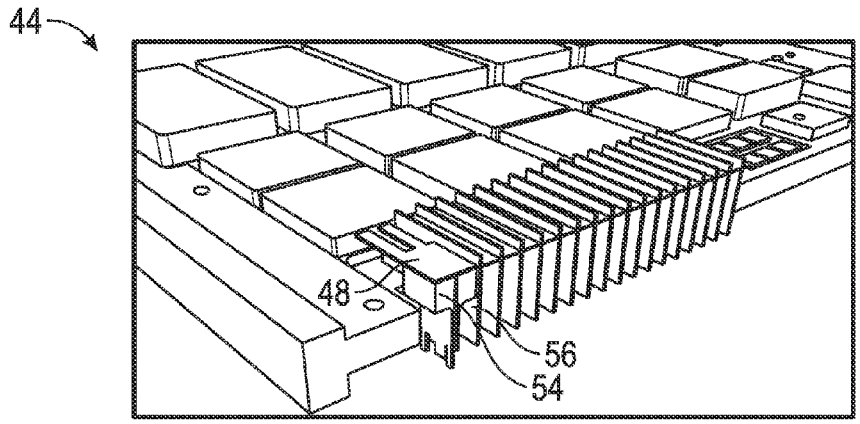
FIG. 7 is a perspective view of an exemplary power interconnect between the power submodule and the Baseboard of a RPM according to certain aspects of this disclosure.

FIG. 7 is a perspective view of an exemplary power interconnect between the power submodule 40 and the baseboard 50 of a RPM 12 according to certain aspects of this disclosure. In this embodiment, multiple tabs 48 are electrically coupled to the circuits of PCBA 44 of the power submodule 40 and project past an edge of the PCBA 44 to respectively connect to posts 54 that are electrically coupled to the circuits of the baseboard 50. Adjacent pairs of tabs 48 and posts 54 are separated, in this example, by insulators 56. In certain embodiments, the insulators 56 are mechanically coupled to the baseboard 50 while in certain embodiments, the insulators 56 are mechanically coupled to the PCBA 44 of the power submodule 40. The tabs 48 and posts 54 are described in greater detail with respect to FIGS. 8A, 8B, and 9.

Figures 8A, 8B:
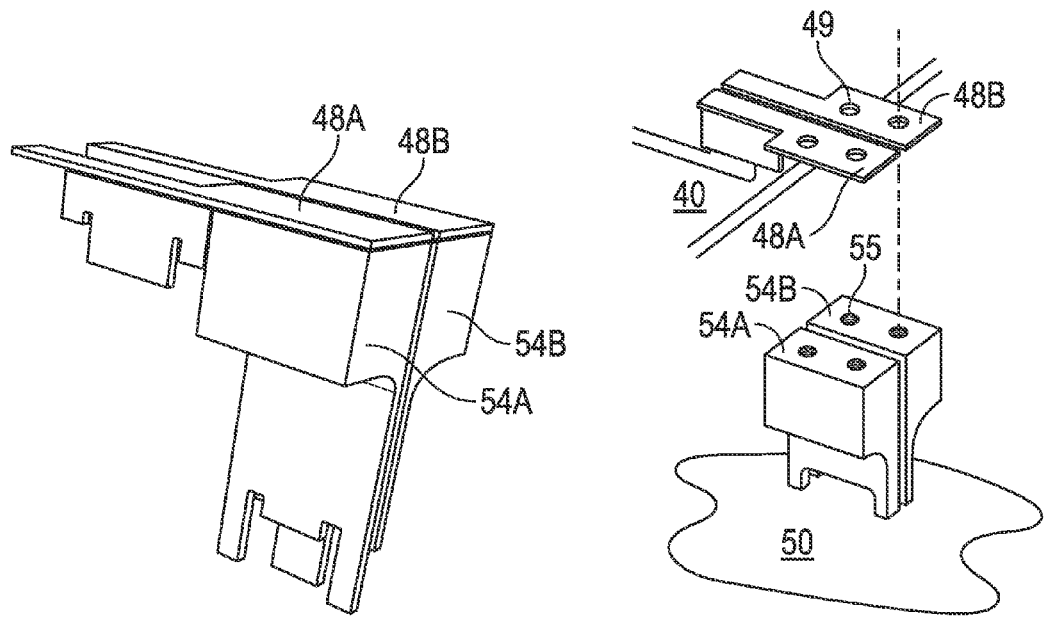
FIGS. 8A and 8B are assembled and separated views of an individual power interconnect of FIG. 7 according to certain aspects of this disclosure.

FIGS. 8A and 8B are assembled and separated views of an individual power interconnect of FIG. 7 according to certain aspects of this disclosure. FIG. 8A shows a pair of lines, such as a differential signal pair or a power supply and return pair, connected across tabs 48A, 48B and posts 54A, 54B, respectively. The insulators adjacent to and between the pair of tabs/posts has been removed for clarity.

FIG. 8B shows the tabs 48A, 48B and the posts 54A, 54B prior to connection. It can be seen that the respective tabs have a contact area equal is size to the top of the posts 54A, 54B such that there is a large contact area between the tabs 48 and the respective posts 54. In certain embodiments, the contact area is greater than 21 square millimeters ($mm^2$), for example an area approximately 3 mm×7 mm. In certain embodiments, the contact area is greater than 50 $mm^2$, for example an area approximately 5 mm×10 mm. The tabs 48A, 48B have through holes 49 that align with threaded holes 55 in the posts 54A, 54B. The tabs 48A, 48B are respectively clamped to the tops of posts 54A, 54B using screws (not shown) such that at least a large portion of the contact surfaces are pressed against one another, compared to point contact or line contact in a conventional pin-an-socket connector (not shown). In certain embodiments, the use of clamping elements, such as a threaded fastener or screw, to hold a tab 48 in contact with a post 54 may provide a large contact force between the mated flat surfaces of the tab 48 and post 54 and thereby increasing the metal-to-metal contact between the tab 48 and post 54 thereby reducing the impedance of the connection. The large contact area between a tab 48 and a post 54 provides a de-matable, hi-current, low-impedance connection that is especially important for low-voltage power transfer from the power submodule 40 to the baseboard 50 without excessive losses or voltage drop, compared to a conventional pin-an-socket connector.

Figure 9:
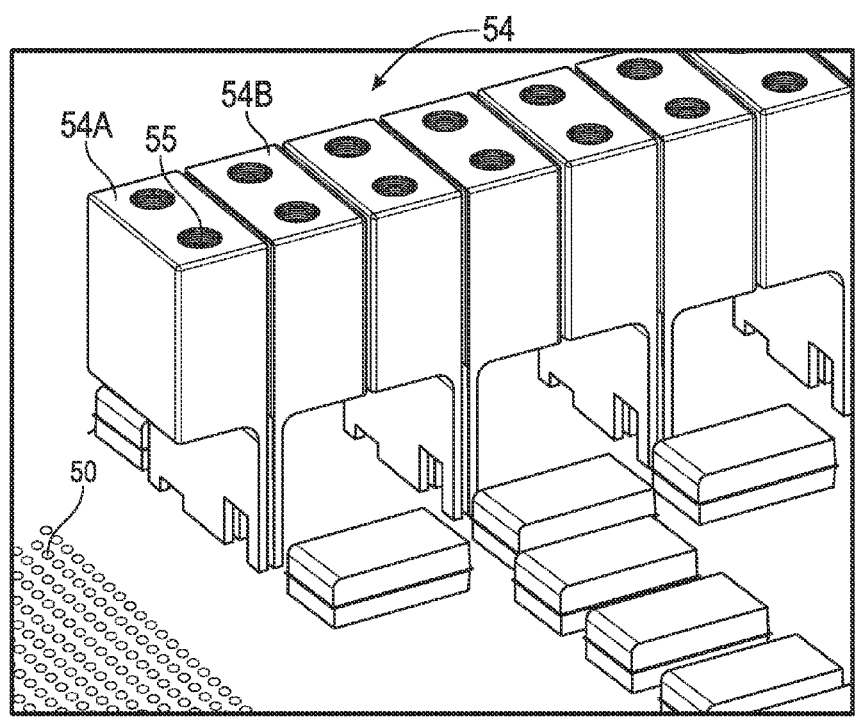
FIG. 9 is a perspective view of the posts that are part of the power interconnect assembled into the baseboard according to certain aspects of this disclosure.

FIG. 9 is a perspective view of posts 54 that are part of the power interconnect assembled into the baseboard 50 according to certain aspects of this disclosure. In certain embodiments, the posts 54 comprise copper with a gold coating. It can be seen how the connection points of the posts 54 to the baseboard 50 are offset such that paired posts, such as posts 54A and 54B, are close to each other while maintaining the large contact area at the top of the posts 54.

Figure 10:
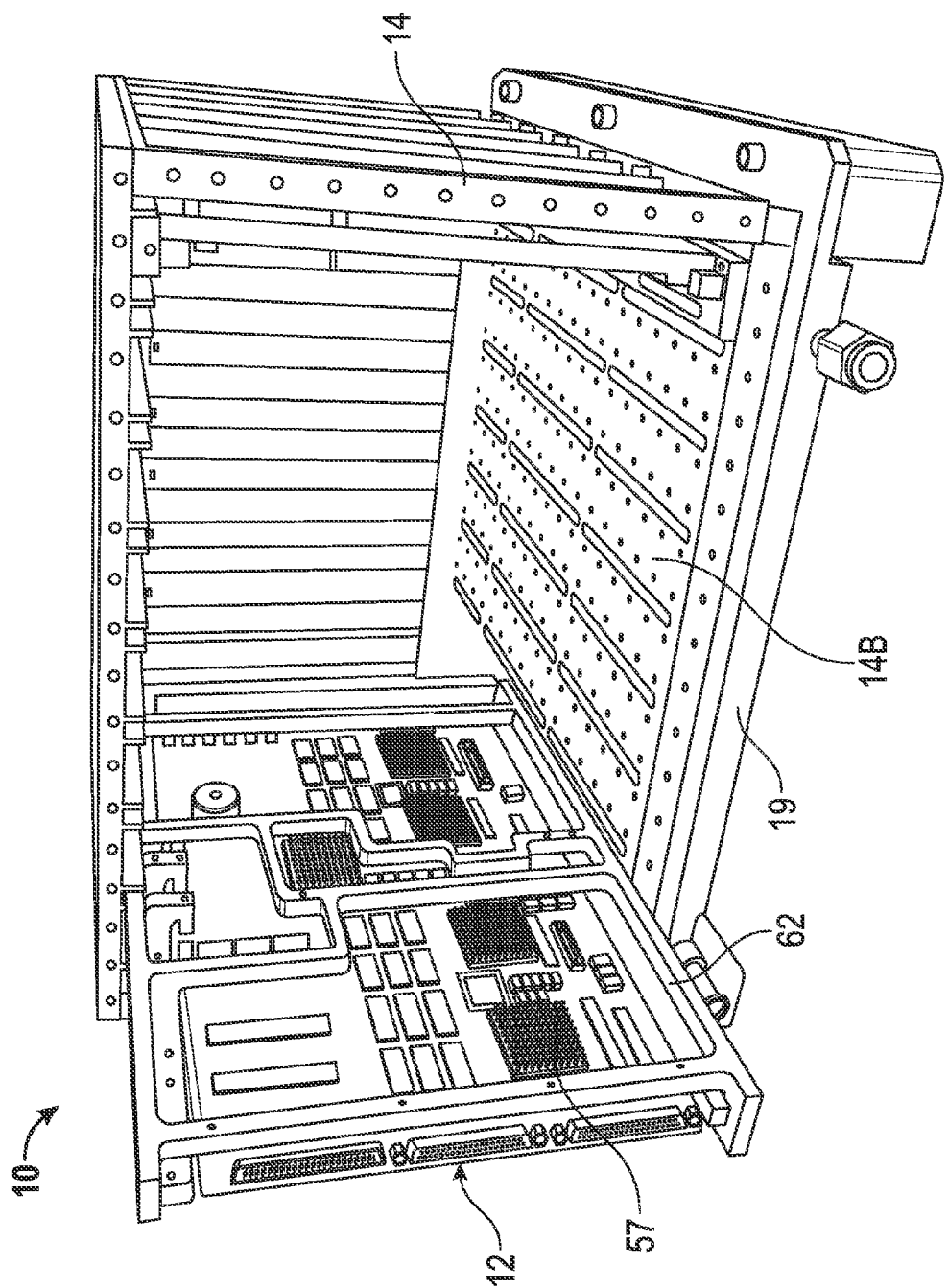
FIG. 10 depicts an example RPM with an attached heat sink frame partially inserted into an example chassis according to certain aspects of this disclosure.

FIG. 10 depicts an example RPM 12 with an attached heat sink frame 62 partially inserted into an example chassis 14 according to certain aspects of this disclosure. In this embodiment, the heat sink frame 62 is configured to provide primarily structural support to the baseboard 50 and heat is dissipated from devices mounted on the baseboard 50 primarily by individual heat sinks 57. It can be seen that the internal surface of the bottom panel 14B is smooth and flat in the areas that are in contact with the heat sink 62 when RPM 12 is installed in the chassis 14. It is advantageous that the thermal transfer path from the RPM 12 to the chassis 14, i.e. from the bottom of the heat sink frame 62 to the bottom panel 14B, is not co-located with the electrical connectors between the RPMs 12 and the backplane 16 as this provides a greater thermal transfer capability and allows the use of higher-power electronics in the RPMs 12. In certain embodiments, a secondary heat sink 68 is thermally coupled to the power submodule 40 (neither visible in FIG. 10 but shown in FIG. 4A) and also thermally coupled to the heat sink frame 62 such that heat from the power conversion components is transferred to the chassis 14 without passing through the baseboard 50.

FIG. 10 also shows a heat removal plate 19 coupled to the bottom panel 14B so as to directly remove heat conducted from the RPM 12 into the bottom panel 14B. In certain embodiments, the bottom panel 14B is attached to the spacecraft that serves as a heat removal structure in place of the heat removal plate 19.

Figure 11:
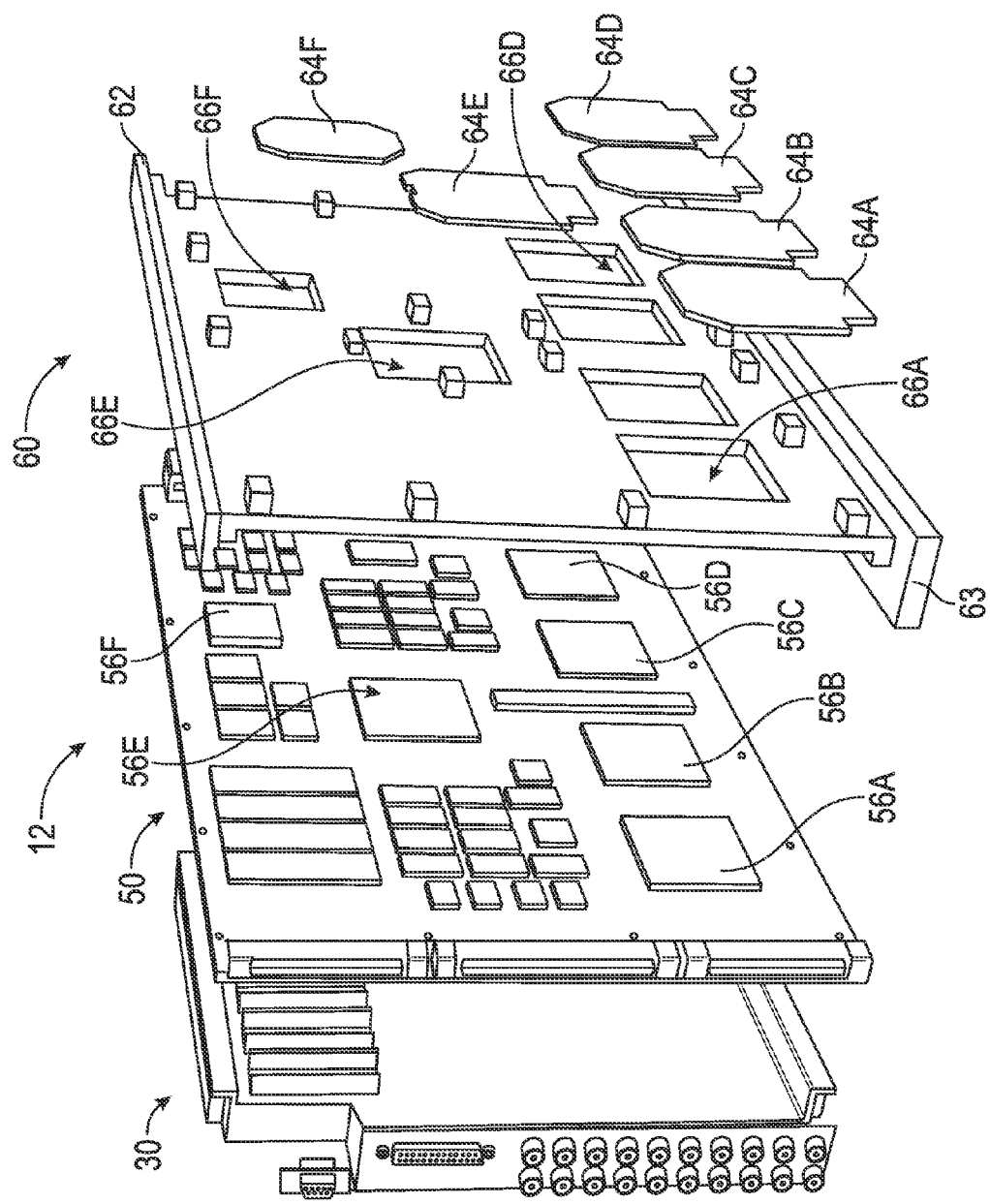
FIG. 11 is a reverse view of the exploded RPM of FIG. 4 according to certain aspects of this disclosure.

FIG. 11 is a reverse view of the exploded RPM of FIG. 4 according to certain aspects of this disclosure. In this example, the heat sink plate 62 covers most of the area of the baseboard 50 with openings 66A-66F located over heat generating components 56A-56F. The individual heat sinks 57 shown in FIG. 10 are not used. Thermal transfer covers 64A-64F are mounted over the openings 66A-66F and configured such that the thermal transfer covers 64A-64F contact the heat-generating devices 56A-56F as well as the heat sink plate 62. Heat is thus conducted directly from the devices 56A-56F into the heat sink plate 62 and therethrough into the bottom panel 14B. In certain embodiments, the thermal transfer covers 64A-64F are removably attached to the heat sink plate 62, for example using screws or other fasteners (not shown). In certain embodiments, the thermal transfer covers 64A-64F comprise compliant elements such that the contact with heat-generating devices 56A-56F in under compressive stress to improve the thermal contact. In certain embodiments, a thermal compound (not shown) is provided between the thermal transfer covers 64A-64F and the devices 56A-56F and the heat sink plate 62.

FIGS. 12-15 are schematics showing exemplary configurations of the backplane 16 to provide various types of redundancy of RPMs 12 according to certain aspects of this disclosure. In certain embodiments, the backplane 16 is completely passive, i.e. comprises no active devices. In certain embodiments, the backplane 16 is configured to support Space Wire network connections. In certain embodiments, the backplane 16 is configured to support communication between serializer/deserializer (SerDes) devices, also referred to as MGTs, referring to FIG. 5. In certain embodiments, only signals and ground references are passed through the backplane 16, i.e. no power is provided through the backplane 16. The configuration of the backplane 16 defines the type of redundancy provided within the CMP 10.

In FIGS. 12-15, interconnections between RPMs 12 are shown as single lines. Within FIGS. 12-15, each line represents a plurality of connections that may include different types of communication, such as serial and parallel, as well as ground references. In certain embodiments, the configuration of all lines in a particular figure are identical. In certain embodiments, the configuration of lines to a certain configuration of RPM 12 are different from the configuration of lines between other configurations of RPMs 12. In certain embodiments, the configuration of lines are different between figures.

Figure 12:
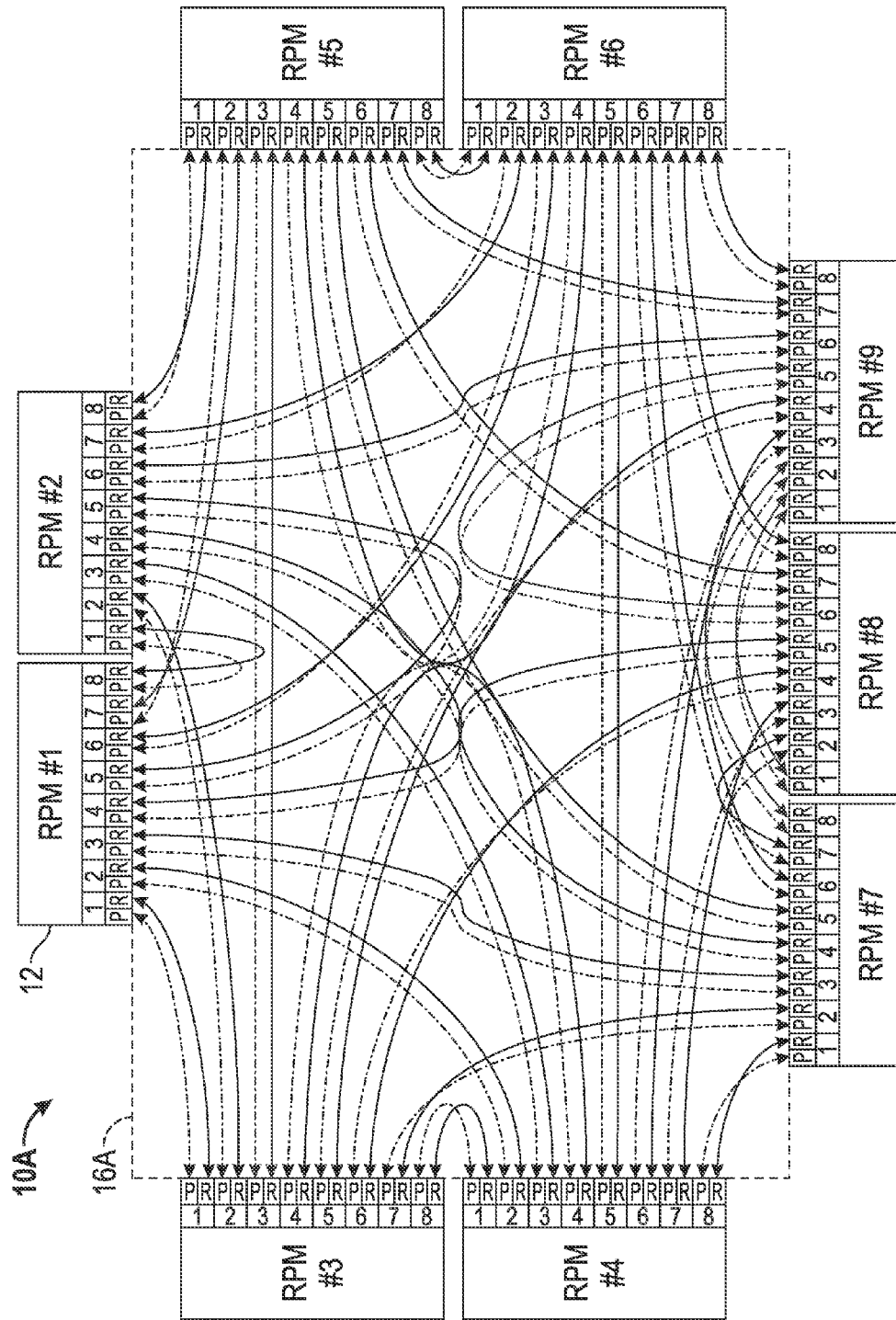
FIGS. 12-15 are schematics showing exemplary configurations of the backplane to provide various types of redundancy of CMPs according to certain aspects of this disclosure.

FIG. 12 depicts a schematic of a backplane 16A configured to provide a fully redundant mesh network within a CMP 10A having nine RPMs 12. Each RPM 12 connects to each of the other eight RPMs 12 via a redundant pair of communication links. Each configuration of RPM 12 is provided by at least two RPMs 12, for example RPM#1 and RPM#2, RPM#3 and RPM#4, RPM#5 and RPM#6, and the set of RPM#7, RPM#8, and RPM#9.

Figure 13:
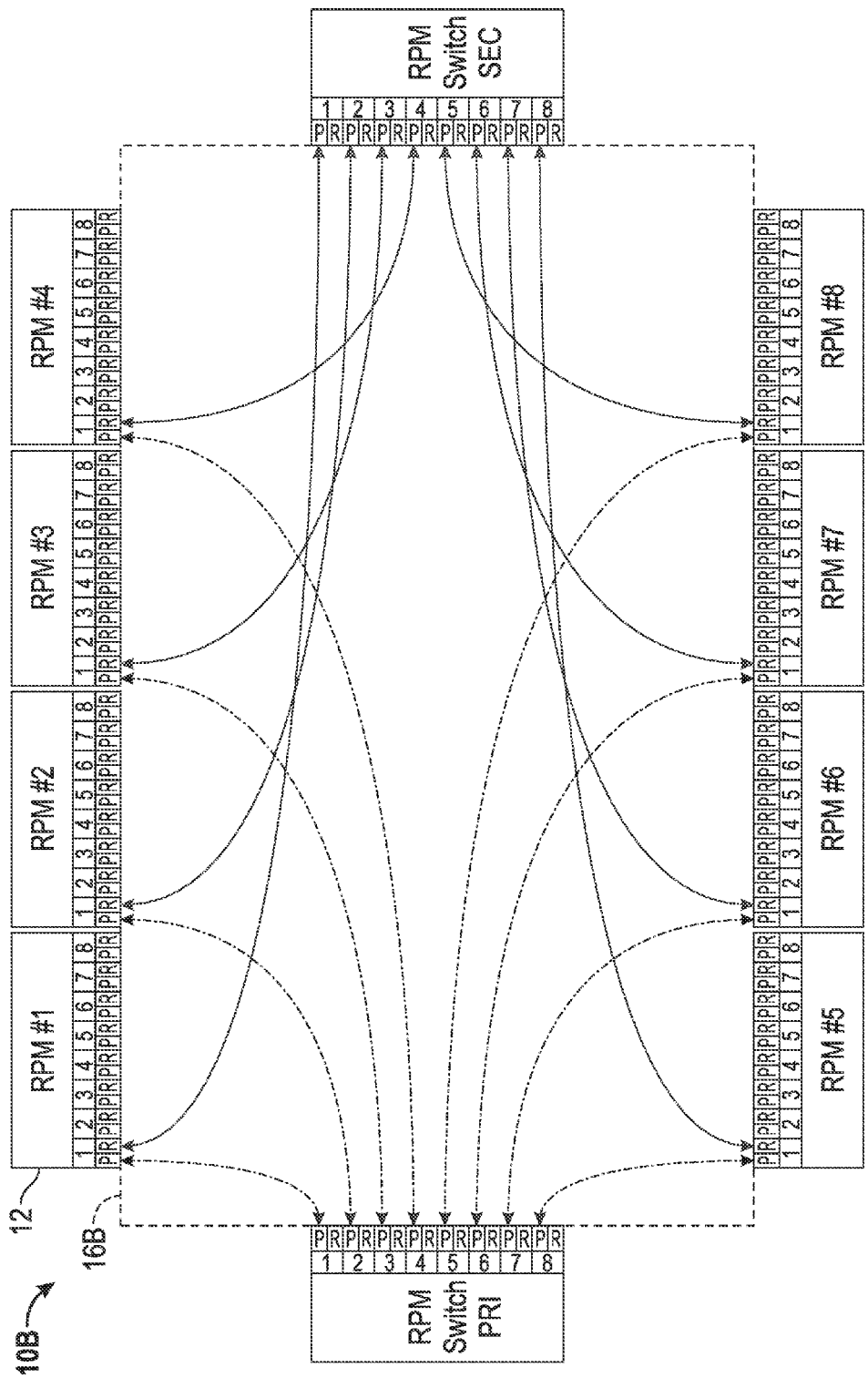

FIG. 13 depicts a schematic of a backplane 16B configured to provide a "M of N" redundant mesh network within a CMP 10B having nine RPMs 12. In this type of redundant architecture, the system starts with N operable components and is fully operational with any M components of the original N are operable.

Figure 14:
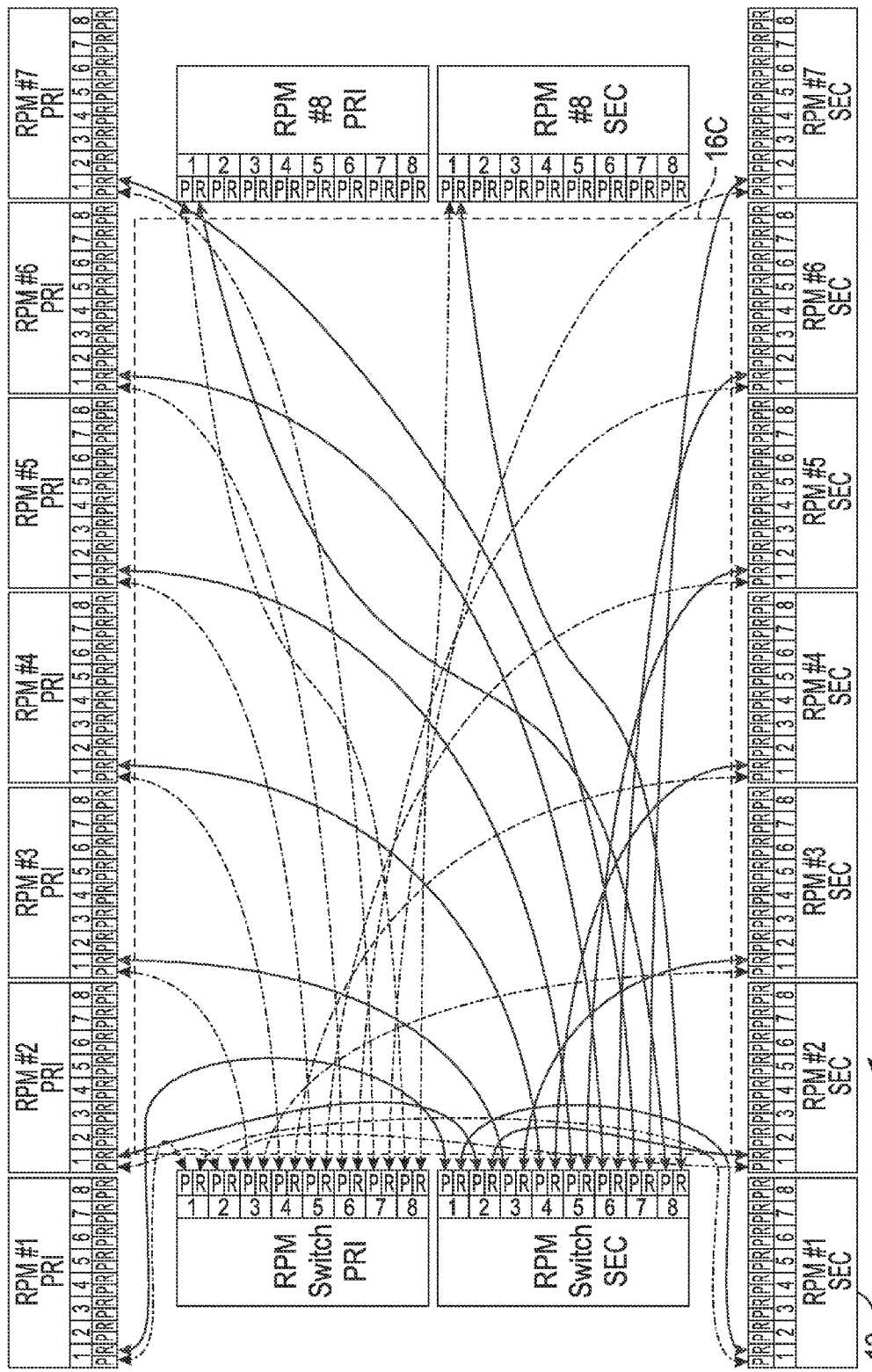

FIG. 14 depicts a schematic of a backplane 16C configured to provide a dual redundant mesh network within a CMP 10C. There are two duplicate sets of eight RPMs 12 and two RPMs configured as switches, such that each set of eight RPMs 12 provides complete functionality.

Figure 15:
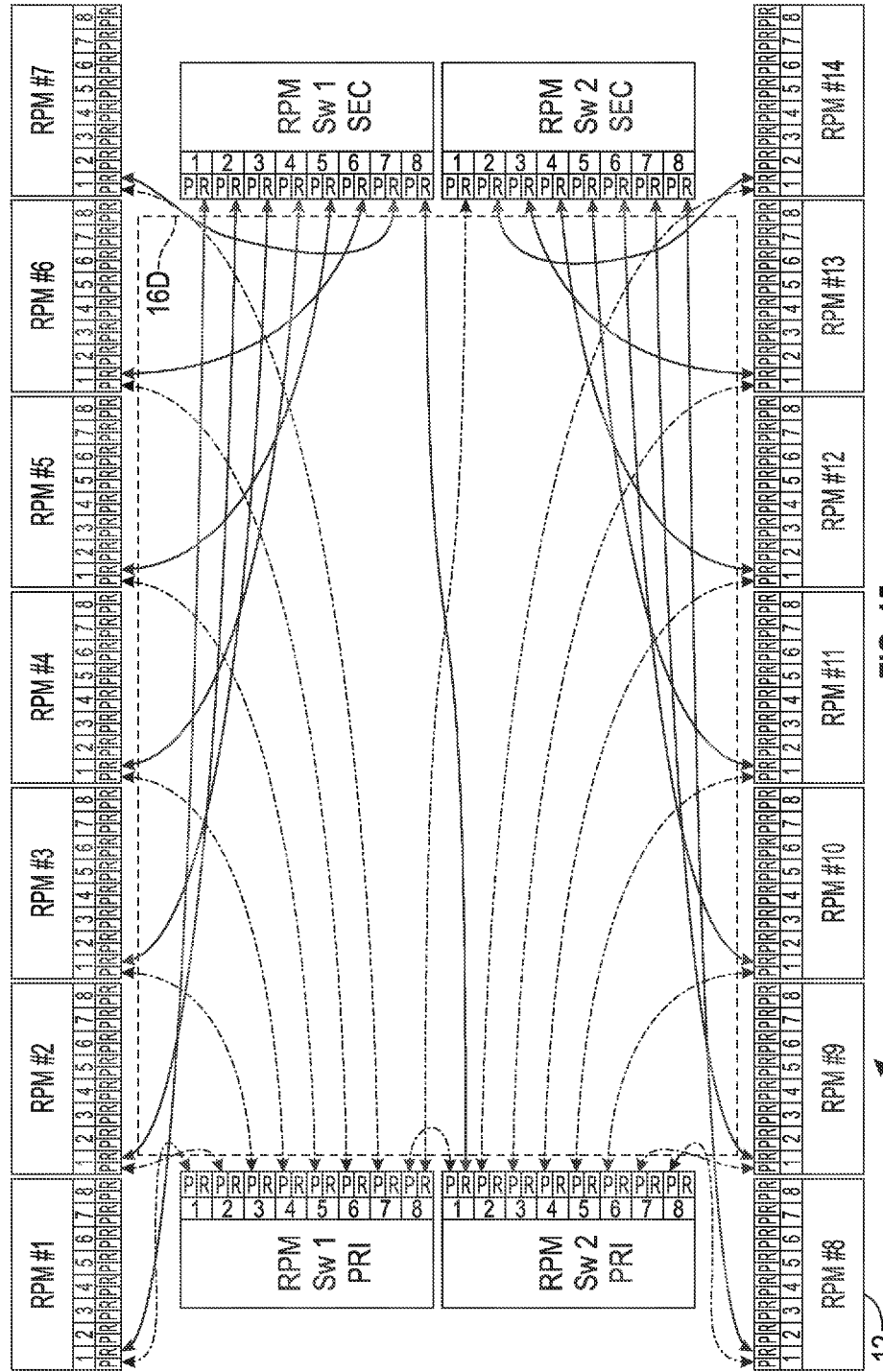

FIG. 15 depicts a schematic of a backplane 16D configured to provide a "M of N redundant×2" mesh network within a CMP 10D. This system is set up with two duplicate sets of seven RPMs 12 and two sets of switches, wherein the Primary side and Secondary side each have two RPMs 12 configured as switches.

The concepts disclosed herein provide a system of modular, configurable hardware that allows mission processors to be developed faster and with less risk than systems using custom-designed hardware. The use of FPGAs on the baseboard allows a tested, verified hardware platform to be configured to provide a variety of functions such as channelization, beamforming, signal detection, focal plane processing, data compression, and data framing/switching. Use of I/O and power submodules allows the efficient tailoring of these portions of the system without requiring a redesign of the main processing capability on the baseboard. A system design wherein a selectable number of programmable modules can be utilized allows the efficient tailoring of the mission processor to the specific payload processing requirements. Interconnection through a passive backplane allows provision of a selectable configuration of system-level redundancy.

The previous description is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Designation of a particular surface, for example a front surface of a mirror, defines the local frame of reference, for example the regions that are in front of and behind the mirror, to be consistent with this designation.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A configurable mission processor (CMP) comprising:
   a chassis;
   a plurality of reprogrammable processor modules (RPMs), each RPM comprising:
     at least one externally accessible interface;
     a configuration manager (CM);
     at least one field programmable gate array (FPGA) having a configuration, the at least one FPGA being directly coupled to the at least one externally accessible interface over a first signal path, the at least one FPGA being directly coupled to the CM over a second signal path different than the first signal path, the CM being directly coupled to the at least one externally accessible interface over a third signal path different than the first and second signal paths, the CM configured to accept a configuration file through the at least one externally accessible interface over the third signal path and to store the configuration file, the CM further configured to selectably program the at least one FPGA over the second signal path using the configuration file; and
     a power submodule comprising at least one externally accessible power connector, the power submodule configured to accept unregulated power through the at least one externally accessible power connector, generate regulated power at a plurality of voltages, and provide the regulated power to the RPM; and
   a backplane coupled to each of the plurality of RPMs, the backplane configured to provide signal and ground interconnections between the RPMs, the backplane having a first connection to the at least one FPGA over a fourth signal path different than the second and third signal paths and a second connection to the at least one FPGA over the first signal path via the at least one externally accessible interface.

2. The CMP of claim 1, wherein the power submodule provides all of the regulated power required by the RPM.

3. The CMP of claim 1, wherein each RPM further comprises an input/output (I/O) submodule comprising at least one externally accessible signal connector and communicatively coupled to the FPGA, the I/O submodule configured to exchange information with external devices through the at least one externally accessible signal connector and exchange at least a portion of the information with the at least one FPGA.

4. The CMP of claim 1, wherein the CM is further configured to:
   the CM comprises a nonvolatile memory configured to store the configuration file; and
   the CM is further configured to accept a reload command through the at least one externally accessible interface and, upon receipt of the reload command, program the at least one FPGA using the configuration file.

5. The CMP of claim 4, wherein the CM is further configured to:
   continuously monitor at least one FPGA;
   detect a Single Event Upset (SEU) that affects the configuration of the monitored at least one FPGA; and
   upon detection of a SEU, autonomously re-program the affected at least one FPGA using the configuration file.

6. The CMP of claim 4, wherein:
   the at least one externally accessible interface comprises a configurable SpaceWire router;
   the nonvolatile memory of the CM is further configured to store SpaceWire router configuration data; and
   the CM is coupled to the Spacewire router and configured to selectably program the SpaceWire router using the SpaceWire router configuration data.

7. The CMP of claim 1, further comprising a chassis, wherein:
   the chassis comprises a cooling plate that is thermally coupled to the chassis and configured to be coupled to an external cooling system;
   at least one RPM comprises a heat sink frame; and
   the heat sink frame and the chassis are configured such that the heat sink frame is thermally coupled to the chassis when the at least one RPM is mounted within the chassis.

8. The CMP of claim 7, wherein:
   the RPM comprises at least one heat-generating device;
   the heat sink comprises a heat sink plate having at least one opening disposed over the at least one heat-generating device; and
   the heat sink further comprises at least one thermal transfer cover configured to removably and thermally couple to the heat sink and thermally contact the heat-generating device within the at least one opening.

9. The CMP of claim 1, wherein the backplane is selected from a group of backplanes each configured to support a selected type of system redundancy within the CMP, the group consisting of a backplane configured to support full redundancy, a backplane configured to support M of N redundancy, a backplane configured to support M of N×2 redundancy, and a backplane configured to support dual redundancy.

10. The CMP of claim 1, wherein:
the RPM further comprises a baseboard that comprises a first connector element of a low-impedance connector; and
the power submodule comprises a second connector element of the low-impedance connector that is mated with the first connector element of the baseboard when the power submodule is coupled to the baseboard;
the power submodule provides the regulated power to the RPM through the low-impedance connector; and
the mated first and second connector elements comprise a low-impedance contact area between the first and second connector elements.

11. The CMP of claim 10, wherein the contact area is greater than 21 square millimeters ($mm^2$).

12. The CMP of claim 11, wherein the contact area is greater than 50 $mm^2$.

13. The CMP of claim 10, wherein the first and second connector elements are configured such that the first and second connector elements can be non-destructively demated.

14. The CMP of claim 10, further comprising a clamping element that creates pressure over the contact area of the mated first and second connector elements, thereby increasing metal-to-metal contact between the first and second connector elements thereby reducing the impedance of the low-impedance connection.

15. The CMP of claim 14, wherein the clamping element comprises a threaded fastener.

16. A module, comprising:
a heat sink;
a baseboard comprising a first connector element of a low-impedance connector, the first connector element having threaded holes at a first flat surface of the first connector element; and
a power submodule coupled to the baseboard, the power submodule comprising a second connector element of the low-impedance connector and at least one externally accessible power connector, the second connector element having through holes at a second flat surface of the second connector element, the power submodule configured to accept unregulated power through the at least one externally accessible power connector and to provide regulated power to the baseboard through the low-impedance connector, the second flat surface of the second connector element overlapping the first flat surface of the first connector element of the baseboard to form a low-impedance contact area between the first connector element and the second connector element, the low-impedance contact area having the threaded holes of the first connector element aligned with the through holes of the second connector element, the heat sink being thermally coupled to the power submodule and to a heat sink frame mechanically coupled to the baseboard, the heat sink configured to transfer heat dissipated from the power submodule and to a chassis through the heat sink frame independent of the baseboard.

17. The module of claim 16, wherein the contact area is greater than 21 square millimeters ($mm^2$).

18. The module of claim 17, wherein the contact area is greater than 50 $mm^2$.

19. The module of claim 16, wherein the first and second connector elements are configured such that the first and second connector elements can be non-destructively demated.

20. The module of claim 16, further comprising a clamping element that creates pressure over the contact area of the mated first and second connector elements, thereby increasing metal-to-metal contact between the first and second connector elements within the contact area thereby reducing the impedance of the low-impedance connection.

21. The module of claim 20, wherein the clamping element comprises a threaded fastener.

* * * * *